(12) United States Patent
Aoki

(10) Patent No.: US 7,569,253 B2
(45) Date of Patent: Aug. 4, 2009

(54) FILM-FORMING METHOD

(75) Inventor: Taiichiro Aoki, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 595 days.

(21) Appl. No.: 10/997,068

(22) Filed: Nov. 24, 2004

(65) Prior Publication Data

US 2005/0196536 A1 Sep. 8, 2005

(30) Foreign Application Priority Data

Dec. 1, 2003 (JP) .............................. 2003-402227

(51) Int. Cl.
*B05D 3/02* (2006.01)
(52) U.S. Cl. .................. 427/372.2; 427/384; 427/385.5
(58) Field of Classification Search ........................ None
See application file for complete search history.

(56) References Cited

U.S. PATENT DOCUMENTS 4,794,021 A * 12/1988 Potter .......................... 427/240
6,284,044 B1 * 9/2001 Sakamoto et al. ............ 118/219
6,609,909 B2 * 8/2003 Aoki et al. .................... 432/258
7,005,009 B2 * 2/2006 Aoki et al. ..................... 118/66
7,153,365 B2 * 12/2006 Aoki ........................... 118/500
7,166,184 B2 * 1/2007 Nakamura et al. ...... 156/345.22

FOREIGN PATENT DOCUMENTS

| EP | 917184 A2 * | 5/1999 |
| EP | 917184 A3 * | 5/1999 |
| JP | 2002-324745 | 11/2002 |

* cited by examiner

*Primary Examiner*—Erma Cameron
(74) *Attorney, Agent, or Firm*—Carrier, Blackman & Associates, P.C.; William D. Blackman; Joseph P. Carrier

(57) ABSTRACT

A film-forming method is provided in which generation of an edge bead can be prevented even in a case where the thickness of a coating solution is large, and includes the steps of applying a coating solution onto a substrate to be treated such that thickness of the coating solution is 20 μm or more, placing the substrate into a heating space defined within an oven unit in which heating devices are provided in upper and lower portions of the heating space, and heating the substrate at a temperature-rising rate of 80 to 120° C./10 min so as to remove a solvent within the coating solution while keeping the substrate in a non-contact state with respect to the heating devices.

19 Claims, 4 Drawing Sheets

FILM-FORMING METHOD

BACKGROUND OF THE INVENTION

1. Field of the Invention

The present invention relates to a method for forming a film having a thickness of 20 μm or more on a surface of a semiconductor wafer or a glass substrate.

2. Description of the Prior Art

Recently, trials of forming a thick resist film on a surface of a substrate have been performed. For example, in order to form a protruding electrode, which is referred to as a bump, having a height of around 20 μm on a surface of an IC pattern by applying integrated circuit forming technology, a resist film having a thickness of around 20 μm is formed on a surface of a substrate, exposure is conducted to this resist film through a mask, and development is conducted so as to provide an opening in the area to be formed into a bump. Next, this opening is filled with metal by plating or CVD, and thereafter an ashing process is conducted to the resist film so as to finally form a bump.

In addition, wire bonding, which has conventionally been used for mounting an IC chip on a substrate, requires labor and time because it is necessary to connect metal wires one by one in wire bonding. Thus, instead of wire bonding, there is another way, in which a plurality of metal posts are provided on a chip, and the chip is mounted on a substrate via the posts. The metal posts have a height of around 100 μm, and the metal posts are formed by the same method as mentioned above.

As a method for forming a resist film in which a resist solution is applied onto a substrate to be treated, and thereafter a solvent within the resist solution is removed, Document 1 has disclosed that a substrate to be treated on which a resist solution has been applied is mounted directly on a hot plate so as to be heated.

[Document 1] Japanese Patent Application Publication No.2002-324745, paragraph 0017

FIG. 5 (a) shows a state where a substrate on which a resist solution has been applied is mounted on a hot plate. In this instance, the thickness of the resist solution is initially uniform. Then, the substrate and the resist solution are heated, which causes convection to the resist solution due to the temperature difference between the lower side and the upper side of the resist solution. As shown in FIG. 5 (b), the convection moves the resist solution still having flowability toward the outside so as to form a bead portion (projection) at the edge.

As for the shape of the bead portion, it is slightly projected in an area about 5 mm from the outer periphery, its thickness is then gradually decreased toward the outside, and finally the thickness is significantly increased in the most outside area. It is assumed that the reason why the bead portion has two stages is the influence of the convection. However, the precise reason is unknown. In any event, when such a bead portion has been formed, it becomes necessary to remove the inside projection and the significantly increased thickness at the most outside area thereof by using a rinse liquid. Consequently, an effective area for forming a circuit is undesirably decreased.

In a case of the relatively small thickness of a common resist film, even if only one side is heated, the temperature difference between the lower side and the upper side of the resist solution is small, and no convection so as to form a bead portion occurs. However, in the case of the resist film for forming a bump or metal posts, since the thickness is 20 μm or more, convection easily occurs.

SUMMARY OF THE INVENTION

In order to solve the above-mentioned problem, according to the present invention, there is provided a film-forming method, comprising the steps of applying a coating solution onto a substrate to be treated such that the thickness is 20 μm or more, placing the substrate to be treated into a heating space such as an oven unit in which heating means are provided in the upper portion and the lower portion, and heating the substrate to be treated at a temperature-rising rate of about 50 to 90° C. during a 10 minute period, so as to remove a solvent within the coating solution while keeping the substrate to be treated in a non-contact state with respect to the heating means. By heating the coating solution gradually and overall, it is possible to prevent convection from being generated.

Also, by preparing a tray having a recessed portion whose depth is substantially the same as the thickness of the substrate to be treated and whose size is slightly larger than that of the substrate to be treated, conducting the above-mentioned applying step in a state where the substrate to be treated is fit into the recessed portion of the tray, and placing the substrate into the heating space in the same state, it is possible to further prevent an edge bead from being generated.

DETAILED DESCRIPTION OF THE PREFERRED EMBODIMENTS

Figure 1:
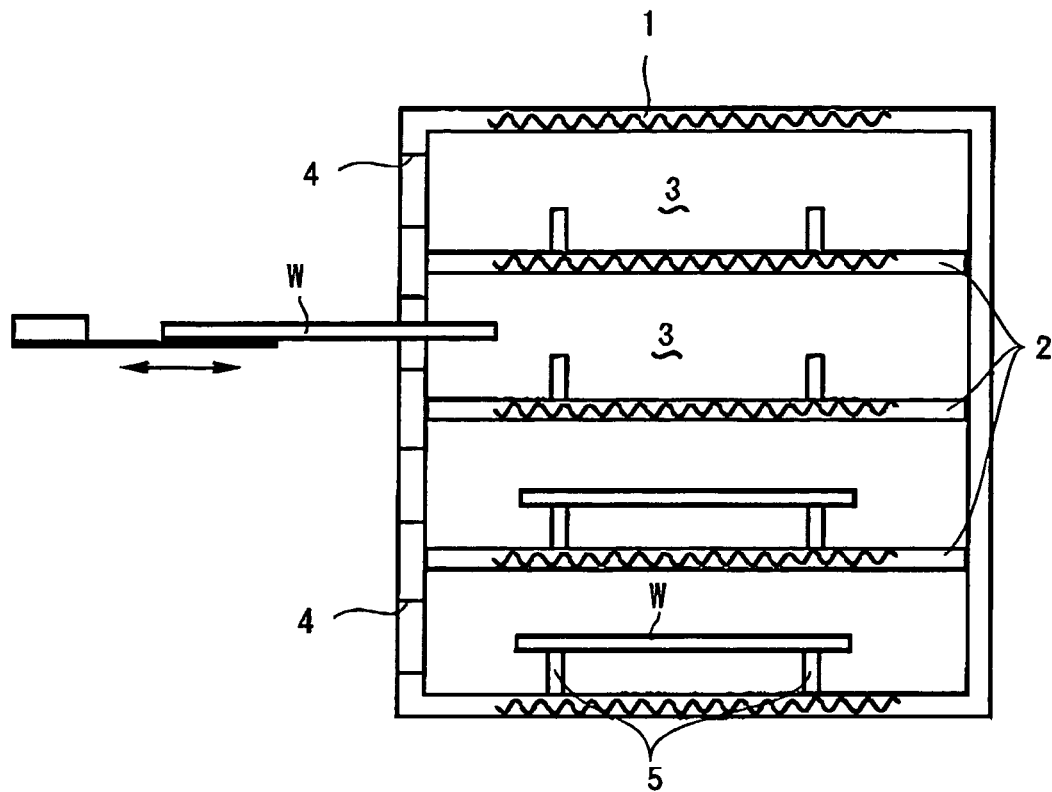
FIG. 1 is a cross-sectional view of an oven unit used for an exemplary embodiment of a film-forming method according to the present invention.

Embodiments of the present invention will be described below with reference to the attached drawings. FIG. 1 is a cross-sectional view of an oven unit used for a film-forming method according to the present invention. In the oven unit, a case 1 is divided into a plurality of heating treatment spaces 3 in a vertical direction by partition plates 2, and substrates to be treated W are put into and taken from the heating treatment spaces 3 via openings 4.

In practicing the method according to the present invention, a respective heating device is operatively associated with the bottom surface of the case 1, with the interior top surface of the case 1, and with each of the heating plates 2. In the depicted embodiment, a heater is embedded in the ceiling surface and the bottom surface of the case 1, and each of the partition plates 2. Pins 5 are provided in the upper surface of the partition plate 2, so that the substrate to be treated W can be mounted thereon. With the provision of the pins, the substrate to be treated W can be kept in a non-contact state with respect to the heater, and the resist solution (coating solution) applied onto a surface of the substrate W can be heated from above and below.

Figure 2:
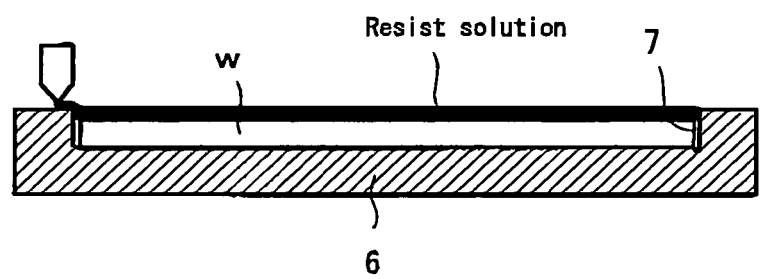
FIG. 2 is a cross-sectional view showing a state where a substrate to be treated is fit into a tray according to an exemplary embodiment of the present invention.

As shown in FIG. 2, the resist solution may be applied onto a surface of the substrate W in a state where the substrate W is fit into a recessed portion 7 provided in a tray 6. In this case, the substrate W may be put into the oven unit while still fit into the tray 6. The depth of the recessed portion 7 is substantially the same as the thickness of the substrate W onto which the resist solution has been applied. Also, the recessed portion 7 has a similar but slightly larger shape with respect to the substrate W. In the drawing, the top surface of the periphery of the tray 6 is slightly higher than the upper surface of the substrate W before the resist solution is applied. However, these surfaces may be arranged to be in the same plane. Since application of the resist solution is finished after the resist solution overreaches the boundary between the wafer and the tray toward the tray, when heating is conducted in a state where the substrate W is fit into the tray, generation of an edge bead can be prevented more than the case where no tray is used.

Table 1 shows the temperature uniformity in a case where a substrate to be treated W is heated by the method according to an exemplary embodiment of the present invention. For measurement, 17 measurement points are predetermined in each substrate to be treated W in the same way. In Table 1, "average per stage of 0.4 in 80° C.", which is a value showing the uniformity, means that the highest temperature of the substrate in the measurement points is 80+0.2° C. and the lowest is 80-0.2° C. in a case where the substrate is gradually heated for 10 minutes so as to be 80° C. in a single heating treatment space.

Figure 4:
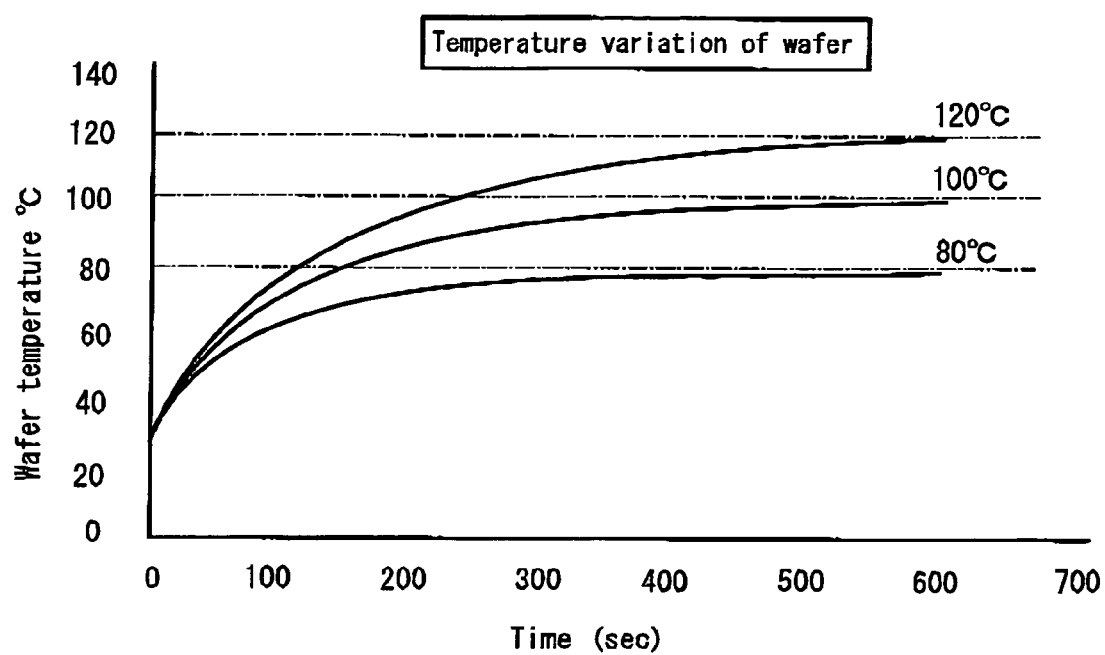
FIG. 4 is a graph showing the temperature-rising rate of a substrate in the heating step according to an exemplary embodiment of the present invention.

Incidentally, as shown in FIG. 4, the temperature-rising rate is gradually decreased over time.

From Table 1, it turned out that the temperature non-uniformity is extremely low when the substrate is gradually heated such that the temperature changes from a beginning temperature of about 30° C. to a final temperature in a range of about 80° C. to about 120° C. during a 10 minute period. Thus, according to the present invention, the substrate is heated at a temperature-rising rate of about 50 to 90° C. in 10 mm so as to remove a solvent within the coating solution, while keeping a substantially uniform temperature at different areas of the substrate and while keeping the substrate in a non-contact state with respect to the heating devices, such that convection is substantially prevented from being generated relative to the coating solution.

TABLE 1

| Set temperature | 80° C. | 100° C. | 120° C. | 180° C. |
|---|---|---|---|---|
| Average per stage | 0.4 | 0.5 | 0.7 | 0.9 |
| Whole unit | 1.1 | 1.0 | 1.7 | 1.8 |

Figure 3:
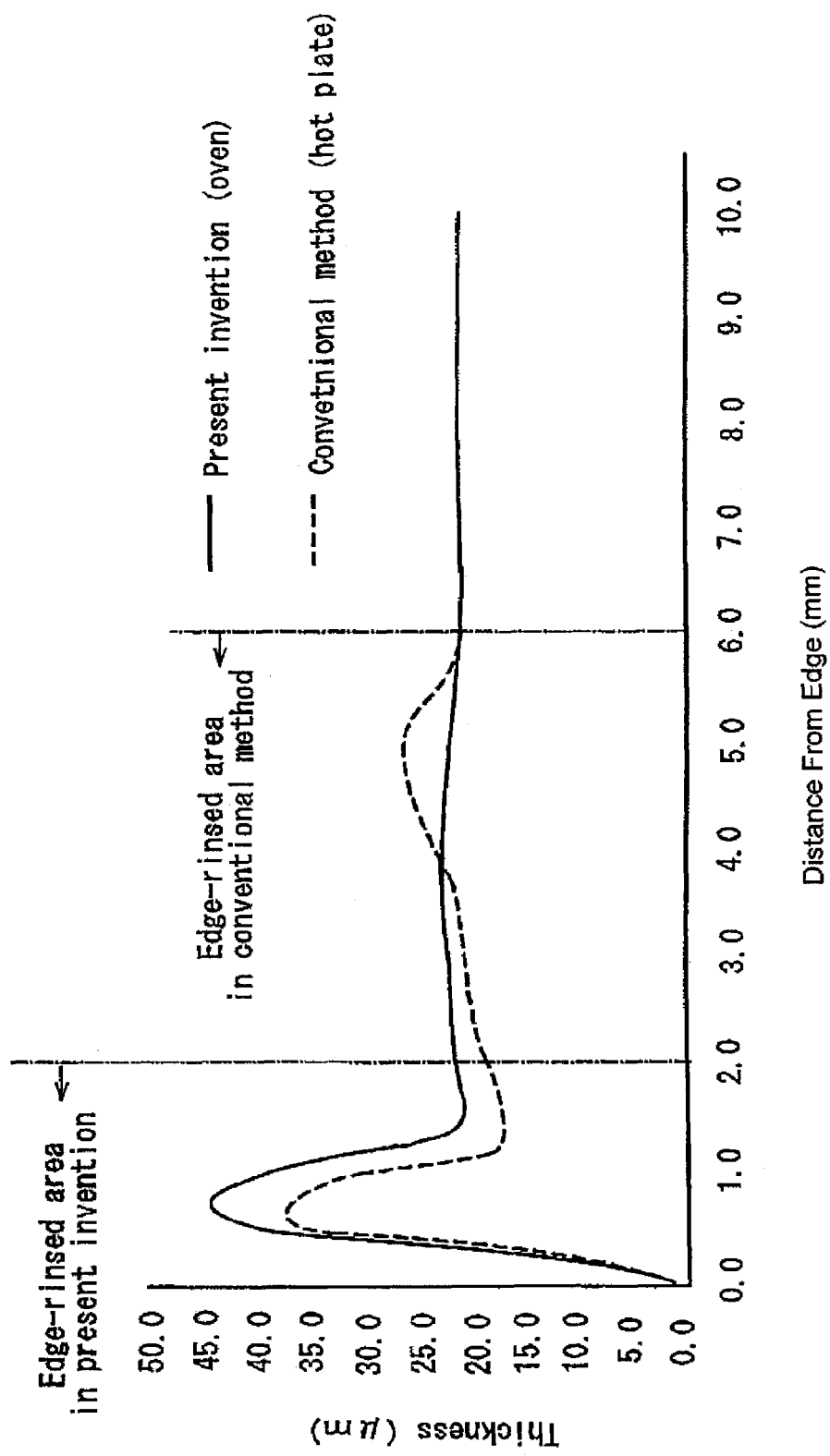
FIG. 3 shows the thickness distribution of a resist film formed by an exemplary embodiment of the present invention and a conventional method.

FIG. 3 shows the comparison of the following two cases:

A photoresist (PMER LA900: Manufactured by Tokyo Ohka Kogyo Co., LTD.) was applied to a semiconductor wafer such that the thickness is 20 μm. In order to form a film, in one case, the semiconductor wafer was heated at a temperature-rising rate of 80 to 120° C./10 min by using the oven unit shown in FIG. 1. In the other case, the semiconductor wafer was heated in a state of being disposed directly in contact with a conventional hot plate.

As seen from FIG. 3, in the case of the conventional hot plate, a projection having a height of 7 to 8 μm was formed at a position measured 5 mm from the outer peripheral end towards the inside in a radial direction. Therefore, it is necessary to remove the outer peripheral portion measured 6 mm from the outer peripheral end towards the inside in a radial direction by using a rinse liquid.

On the other hand, in the case of the present invention using the oven unit of FIG. 1, for example, a slight projection was formed at a position measured 4 mm from the outer peripheral end towards the inside in a radial direction. However, since the projection does not substantially affect the uniformity, it is enough to remove the outer peripheral portion measured 2 mm from the outer peripheral end towards the inside in a radial direction by using a rinse liquid.

EFFECT OF THE INVENTION

According to the present invention, since the coating solution applied onto the substrate is heated without directly contacting the substrate with the heating device, the temperature difference between the lower side and the upper side of the coating solution can be decreased even in a case where the thickness of the coating solution is large. Consequently, it is possible to substantially prevent convection from being generated. It is also possible to substantially prevent an edge bead from being generated, and thereby a film having a uniform thickness can be obtained.

What is claimed is:

1. A film-forming method, comprising the steps of:
    applying a coating solution onto a substrate to be treated such that thickness of the coating solution is 20 μm or more;
    placing the substrate into a heating space defined within an oven unit in which heating devices are provided in upper and lower portions of the heating space; and
    heating the substrate from room temperature at a temperature-rising rate from a beginning temperature of about 30° C. to a final temperature in a range of about 80°, 100° or 120° C. in ten minutes so as to remove a solvent within the coating solution while keeping a substantially uniform temperature at different areas of the substrate and while keeping the substrate in a non-contact state with respect to the heating devices such that convection is substantially prevented from being generated relative to the coating solution.

2. The film-forming method of claim 1, further comprising the steps of:
    preparing a tray having a recessed portion having a depth which is substantially the same as a thickness of the substrate and having a size is slightly larger than that of the substrate; and
    fitting the substrate into the recessed portion of the tray prior to the coating solution applying step; and wherein
    the coating solution is applied onto the substrate while the substrate is disposed in the recessed portion of the tray;
    the coated substrate as disposed in the recessed portion of the tray is placed in the heating space of the oven unit; and
    the substrate is heated in said heating step while keeping the substrate and the tray in a non-contact state with respect to the heating devices.

3. The film-forming method of claim 1, wherein the oven unit has a plurality of spaced partitions which divide the heating space into a plurality of individual heating spaces formed by horizontal partition support surfaces, an interior bottom surface and an interior top surface of the oven.

4. The film-forming method of claim 3, wherein the heating devices provided in upper and lower portions of the heating space, respectively, are operatively associated with the bottom surface and the interior top surface of the oven, and the oven unit also has a heating device operatively associated with each of the spaced partitions.

5. The film-forming method of claim 3, wherein a plurality of pins are provided to project above each of the horizontal partition support surfaces and on the interior bottom surface of the oven unit, and the substrate is supported on the pins associated with one said surface during the heating step.

6. The film-forming method of claim 1, wherein a plurality of pins are provided to project above a support surface in the heating space and the substrate is supported on the pins during the heating step.

7. The film-forming method of claim 1, wherein the temperature-rising rate is gradually decreased, although the temperature continues to rise, during said heating step.

8. The film-forming method of claim 1, wherein the substrate is placed in a portion of said heating space vertically between said heating devices provided in upper and lower portions of the heating space.

9. The film-forming method of claim 1, comprising the further steps of:
removing the coated substrate from the oven after heating, and
edge-rinsing the coating solution so as to remove a peripheral edge bead portion of the coating solution comprising an edge-rinsed area not greater than 2 mm measured from an outer peripheral edge of the substrate.

10. A film-forming method, comprising the steps of:
preparing a tray having a recessed portion having a depth which is substantially the same as a thickness of a substrate and having a size which is slightly larger than that of the substrate;
fitting the substrate into the recessed portion of the tray;
applying a coating solution onto the substrate as fit into the recessed portion of the tray such that thickness of the coating solution is 20 μm or more;
placing the coated substrate as fit into the recessed portion of the tray into a heating space in which heating devices are provided in upper and lower portions of the heating space; and
heating the substrate from a beginning temperature of about 30° C. to a final temperature in a range of about 80 to about 120° C. in a 10 minute period, so as to remove a solvent within the coating solution while keeping a substantially uniform temperature at different areas of the substrate and while keeping the substrate and the tray in a non-contact state with respect to the heating devices.

11. The film-forming method of claim 10, wherein the heating space is provided within an oven unit, and the oven unit has a plurality of individual heating spaces formed by horizontal partition support surfaces, an interior bottom surface and an interior top surface of the oven.

12. The film-forming method of claim 11, wherein the heating devices provided in upper and lower portions of the heating space, respectively, are operatively associated with the bottom surface and the interior top surface of the oven unit, and a heating device is also operatively associated with each of the spaced partitions.

13. The film-forming method of claim 11, wherein a plurality of pins are provided to project above each of the horizontal partition support surfaces and on the interior bottom surface of the oven unit, and the substrate is supported on the pins associated with one said surface during the heating step.

14. The film-forming method of claim 10, wherein a plurality of pins are provided to project above a support surface in heating space and the tray is supported on the pins during the heating step.

15. The film-forming method of claim 10, wherein the temperature-rising rate is gradually decreased, although the temperature continues to rise, during said heating step.

16. The film-forming method of claim 10, wherein the substrate is placed in a portion of said heating space vertically between said heating devices provided in upper and lower portions of the heating space.

17. The film-forming method of claim 10, comprising the further steps of:
removing the coated substrate from the oven after heating, and
edge-rinsing the coating solution so as to remove a peripheral edge bead portion of the coating solution comprising an edge-rinsed area not greater than 2 mm measured from an outer peripheral edge of the substrate.

18. A film-forming method, comprising the steps of:
applying a coating solution onto a substrate to be treated such that thickness of the coating solution is 20 μm or more;
placing the substrate into a heating space defined within an oven unit having multiple heating devices and multiple heating spaces; and
heating the substrate from a beginning temperature of about 30° C. to a final temperature in a range of about 80 to about 120° C. during a 10 minute period, so as to remove a solvent within the coating solution while keeping the substrate in a non-contact state with respect to the heating devices such that convection is substantially prevented from being generated relative to the coating solution, wherein
said multiple heating spaces are formed by an interior bottom surface of the oven, an interior top surface of the oven, and at least one horizontal partition disposed vertically between the interior bottom and top surfaces, and
at least one said heating device is disposed above and below each of said heating spaces so as to substantially prevent convection from being generated relative to substrates placed in the heating spaces, wherein the substrate placed in the heating space is heated gradually and from plural directions, while keeping a substantially uniform temperature at different areas of the substrate by the heating devices disposed above and below the heating space.

19. The film-forming method of claim 18, comprising the further steps of:
removing the coated substrate from the oven after heating, and
edge-rinsing the coating solution so as to remove a peripheral edge bead portion of the coating solution comprising an edge-rinsed area not greater than 2 mm measured from an outer peripheral edge of the substrate.

* * * * *

UNITED STATES PATENT AND TRADEMARK OFFICE
CERTIFICATE OF CORRECTION

PATENT NO.         : 7,569,253 B2
APPLICATION NO. : 10/997068
DATED              : August 4, 2009
INVENTOR(S)        : Aoki et al.

Figure 5:
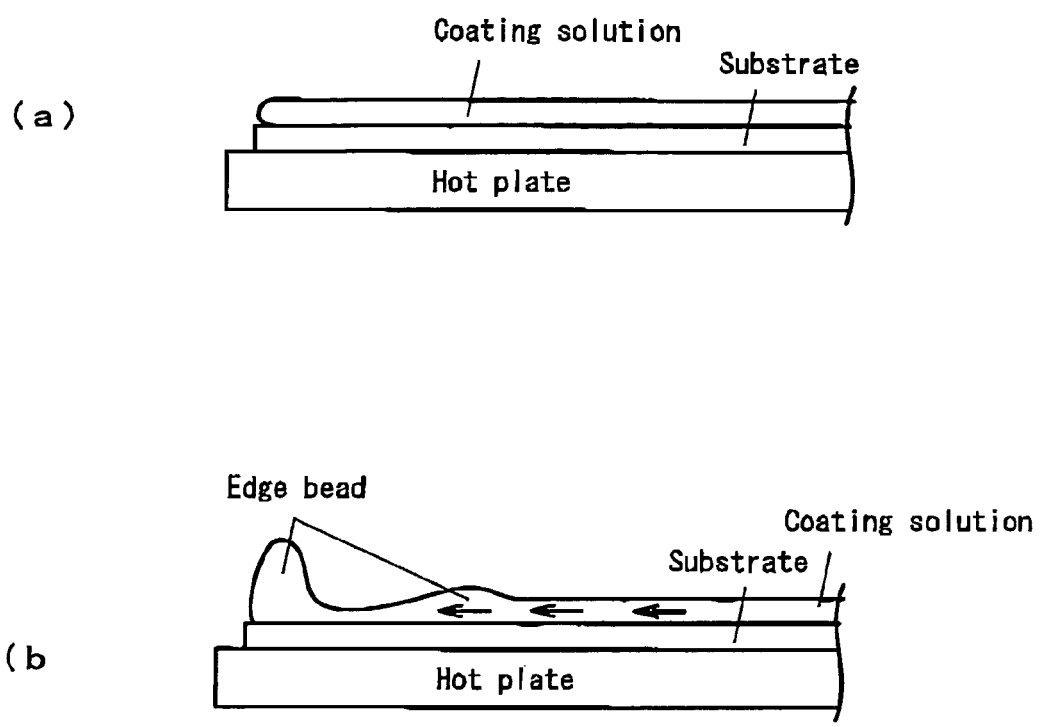
FIGS. 5 (a) and (b) show a process of an edge bead generation when conventional heating is applied to a thick resist film on a substrate.

It is certified that error appears in the above-identified patent and that said Letters Patent is hereby corrected as shown below:

In the drawings:
  Sheet 4 of 4, Fig. 5, in the lower figure view number, change "(b" to --(b)--.

Column 1:
  Line 32, change "is removed, Document" to --is removed. Document--.

Column 2:
  Line 6, change "the thickness is 20 μm" to --the thickness of the coating solution is 20 μm--.
  Line 8, change "heating means are" to --heating devices are--.
  Line 9, change "in the upper portion and the lower portion, and heating" to --in upper and lower portions of the heating space, and heating--.
  Line 14, change "heating means." to --heating devices.--.
  Line 15, change "overall, it is possible to prevent" to --in multiple directions, it is possible to substantially prevent--.
  Line 16, change "erated." to --erated relative to the coating solution.--.
  Line 59, change "embedded in the ceiling" to --embedded in each of the ceiling--.
  Line 60, change "and each of the" to --and in each of the--.
  Line 61, change "upper surface of" to --upper surfaces of--.
  Line 62, change "partition plate 2, so that the substrate" to --partition plates 2, and on the bottom surface of the case 1, so that the substrates--.
  Line 65, change "respect to the heater," to --respect to the heaters,--.
  Line 66, change "onto a surface of the substrate" to --onto surfaces of the substrates--.

Column 3:
  Line 36, change "a 10 minute period." to --a 10-minute period.--.
  Line 39, change "mm" to --min--.

Column 4:
  Line 45, change "size is slightly larger" to --size slightly larger--.
  Line 58, delete "of spaced partitions which divide the".
  Line 59, delete "heating space into a plurality".

Column 5:
  Line 40, change "in a 10 minute" to --in a 10-minute--.
  Lines 46-47, change "and the oven unit has" to --and the heating space has--.

CERTIFICATE OF CORRECTION (continued)
U.S. Pat. No. 7,569,253 B2

Column 6:
  Line 31, change "a 10 minute" to --a 10-minute--.
  Line 40, change "surfaces, and" to --surfaces; and--.
  Line 52, change "after heating," to --after heating;--.

Signed and Sealed this

Second Day of February, 2010

David J. Kappos
*Director of the United States Patent and Trademark Office*